United States Patent
Kusumi

(10) Patent No.: US 7,411,324 B2
(45) Date of Patent: Aug. 12, 2008

(54) GENERATOR-MOTOR

(75) Inventor: Hidetoshi Kusumi, Brussels (BE)

(73) Assignee: Toyota Jidosha Kabushiki Kaisha, Toyota (JP)

( * ) Notice: Subject to any disclaimer, the term of this patent is extended or adjusted under 35 U.S.C. 154(b) by 0 days.

(21) Appl. No.: 10/523,921

(22) PCT Filed: Jul. 31, 2003

(86) PCT No.: PCT/JP03/09769

§ 371 (c)(1),
(2), (4) Date: Feb. 7, 2005

(87) PCT Pub. No.: WO2004/038897

PCT Pub. Date: May 6, 2004

(65) Prior Publication Data

US 2005/0258690 A1    Nov. 24, 2005

(30) Foreign Application Priority Data

Oct. 28, 2002  (JP)  ............................. 2002-313009
Mar. 7, 2003   (JP)  ............................. 2003-061767

(51) Int. Cl.
*H02K 21/00* (2006.01)
(52) U.S. Cl. ............... 310/68 D; 310/71; 310/68 R
(58) Field of Classification Search ............... 310/68 R, 310/71, 68 D, 43, 89, 254, 261, 113
See application file for complete search history.

(56) References Cited

U.S. PATENT DOCUMENTS

| | | | |
|---|---|---|---|
| 4,232,238 A | 11/1980 | Saito et al. | |
| 4,797,602 A | 1/1989 | West | |
| 4,799,309 A * | 1/1989 | Cinzori et al. | 29/596 |
| 5,686,780 A * | 11/1997 | Adachi et al. | 310/68 D |
| 5,694,313 A | 12/1997 | Ooiwa | |
| 5,705,902 A | 1/1998 | Merritt et al. | |
| 5,742,498 A | 4/1998 | Taniguchi et al. | |
| 6,002,219 A | 12/1999 | Permuy | |
| 6,538,352 B2 | 3/2003 | Asao | |
| 6,538,356 B1 * | 3/2003 | Jones | 310/254 |
| 6,713,888 B2 | 3/2004 | Kajiura | |
| 6,725,821 B2 | 4/2004 | Warren et al. | |
| 6,768,278 B2 * | 7/2004 | Xu et al. | 318/140 |
| 6,806,671 B2 | 10/2004 | Kusaka et al. | |
| 6,882,047 B2 | 4/2005 | Hata et al. | |
| 6,882,072 B2 * | 4/2005 | Wingett et al. | 310/74 |
| 6,977,453 B2 * | 12/2005 | Yoda et al. | 310/156.46 |
| 6,979,927 B2 * | 12/2005 | Kometani et al. | 310/193 |

(Continued)

FOREIGN PATENT DOCUMENTS

CN    1074198 C    10/2001

(Continued)

*Primary Examiner*—Thanh Lam
(74) *Attorney, Agent, or Firm*—Oliff & Berridge, PLC

(57) ABSTRACT

A generator-motor includes an alternator, electrode plates, a substrate, MOS transistors, and an MOS driver. Electrode plates are arranged on an end surface of the alternator so as to substantially form a U-shape to surround a rotation shaft of the alternator. MOS transistors are arranged on the electrode plate, while MOS transistors are arranged on the electrode plates respectively. The MOS driver is provided on the substrate arranged in a substantially U-shaped notch, and controls turn-on/off of the MOS transistors.

14 Claims, 9 Drawing Sheets

U.S. PATENT DOCUMENTS

2002/0158523 A1 * 10/2002 Abadia et al. ............ 310/68 B
2006/0087181 A1    4/2006 Kusumi

FOREIGN PATENT DOCUMENTS

| JP | A-56-081069 | 7/1981 |
| --- | --- | --- |
| JP | A 58-079668 | 5/1983 |
| JP | A 60-216752 | 10/1985 |
| JP | A-61-240666 | 10/1986 |
| JP | A 62-268370 | 11/1987 |
| JP | A 63-202255 | 8/1988 |
| JP | A 02-266855 | 10/1990 |
| JP | U-03-111184 | 11/1991 |
| JP | A-04-011757 | 1/1992 |
| JP | A-05-067889 | 3/1993 |
| JP | A-06-062553 | 3/1994 |
| JP | A 07-184361 | 7/1995 |
| JP | A-08-084439 | 3/1996 |
| JP | A-09-143649 | 6/1997 |
| JP | A-10-056762 | 2/1998 |
| JP | A-11-235051 | 8/1999 |
| JP | A-11-284122 | 10/1999 |
| JP | A 2001-251898 | 9/2001 |
| JP | A 2001-268869 | 9/2001 |
| JP | A-2001-268924 | 9/2001 |
| JP | A-2001-270401 | 10/2001 |
| JP | A-2002-153030 | 5/2002 |

* cited by examiner

F I G. 8 A
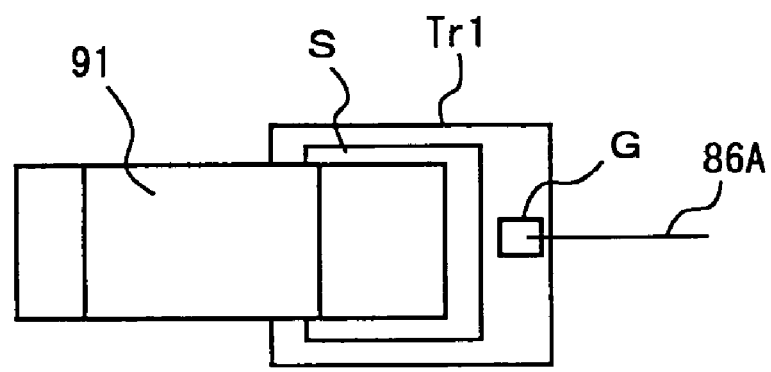
F I G. 8 B
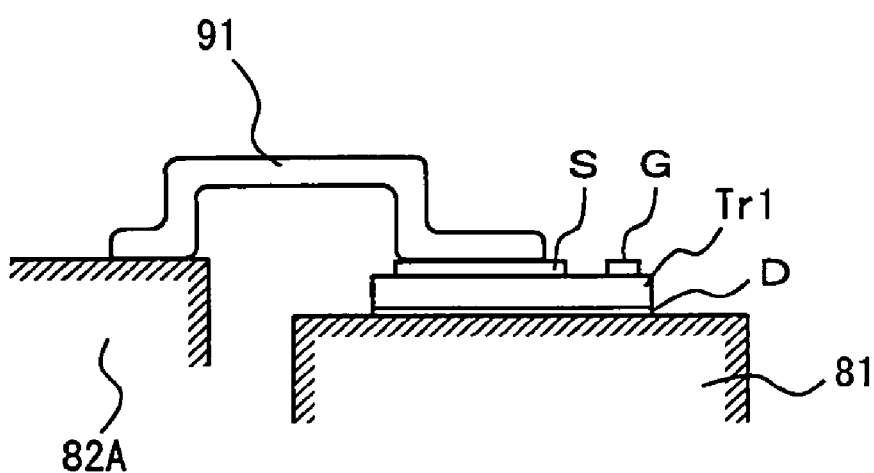

GENERATOR-MOTOR

TECHNICAL FIELD

The present invention relates to a generator-motor including a control device on an end surface, and more particularly to a compact generator-motor.

BACKGROUND ART

Japanese Patent Laying-Open No. 2-266855 discloses a starter-generator attaining a function as a three-phase motor starting an engine mounted on a vehicle and a function as a three-phase AC generator charging a battery.

Referring to FIG. 9, a starter-generator 300 disclosed in Japanese Patent Laying-Open No. 2-266855 includes a motor unit 301 and a drive unit 302. Motor unit 301 includes a stator and a rotor. Drive unit 302 is provided on an end surface 301A of motor unit 301. Drive unit 302 includes a cylindrical member 302A and a power module 302B. Power module 302B is formed on a surface of cylindrical member 302A. That is, power module 302B is arranged in a direction perpendicular to a radial direction 303 of cylindrical member 302A and in a longitudinal direction 304 of a rotation shaft 301B of motor unit 301.

Power module 302B feeds a current to a coil included in motor unit 301 and drives motor unit 301 so that the rotor outputs a prescribed torque. When the rotor in motor unit 301 rotates by rotation power of an engine, an AC voltage induced in three stators is converted to a DC voltage, whereby a battery is charged.

In this manner, power module 302B is provided on end surface 301A of motor unit 301, and drives motor unit 301 as a motor or a generator.

In the conventional starter-generator, however, the power module is arranged in a direction perpendicular to a radial direction when the rotation shaft is assumed as a center and in a longitudinal direction of the rotation shaft. Accordingly, it is difficult to achieve smaller size of the starter-generator.

In particular, when a control circuit to control a generator installed in an engine is incorporated in the generator, a similar problem tends to arise.

As Japanese Patent Laying-Open No. 2-266855 does not clearly disclose a position where an electrode included in the power module is arranged, it is difficult to enhance efficiency in cooling the power module in the conventional starter-generator.

In addition, as Japanese Patent Laying-Open No. 2-266855 does not clearly disclose a position where a wire to the power module is arranged either, it is difficult to achieve shorter length and simplification of the wires in the conventional starter-generator.

DISCLOSURE OF THE INVENTION

From the foregoing, an object of the present invention is to provide a compact generator-motor.

Another object of the present invention is to provide a generator-motor including a control circuit occupying a smaller area.

Yet another object of the present invention is to provide a generator-motor including a control device attaining high cooling efficiency.

Yet another object of the present invention is to provide a generator-motor attaining shorter length and simplification of wires.

According to the present invention, a generator-motor includes a motor and a control device. The motor includes a rotor and a stator, and attains a function as a motor-generator. The control device is arranged on an end surface of the motor so as to surround a rotation shaft of the motor, and controls drive of the motor.

Preferably, the control device includes a first electrode plate, a second electrode plate, a third electrode plate, and a polyphase switching element group. The first, second and third electrode plates are arranged on the end surface of the motor so as to substantially form a U-shape to surround the rotation shaft of the motor. The polyphase switching element group controls a current supplied to the stator of the motor. The polyphase switching element group includes a plurality of arms. The number of the arms corresponds to the number of phases of the motor, and each arm is constituted of first and second switching elements. The first electrode plate is arranged in a position apart from the rotation shaft of the motor by a prescribed distance in a direction perpendicular to the rotation shaft. The second and third electrode plates are arranged outside the first electrode plate. The first and second switching elements are connected electrically in series between the first electrode plate and the third electrode plate. The plurality of first switching elements are arranged on the first electrode plate, and the plurality of second switching elements are arranged on the second electrode plate.

Preferably, the control device further includes a control circuit. The control circuit controls a plurality of first and second switching elements. The control circuit is provided on a ceramic substrate arranged in a direction the same as an inplane direction of the first, second and third electrode plates in a substantially U-shaped notch.

Preferably, the control device further includes a plurality of first wires and a plurality of second wires. The plurality of first wires connect the control circuit to the plurality of first switching elements. The plurality of second wires connect the control circuit to the plurality of second switching elements. The plurality of first wires are arranged between the rotation shaft of the motor and the first electrode plate so as to surround the rotation shaft. The plurality of second wires are arranged between the rotation shaft of the motor and the first electrode plate and between the first electrode plate and the motor.

Preferably, the first and second electrode plates are arranged in a first plane. The third electrode plate is arranged in a second plane different from the first plane.

Preferably, the second plane is closer to the motor than the first plane is.

Preferably, the plurality of arms are arranged radially in the inplane direction of the first, second and third electrode plates.

Preferably, each of the plurality of first and second switching elements has a control terminal, an input terminal, and an output terminal. The control terminal receives a control signal from the plurality of first wires or the plurality of second wires. The input terminal receives a direct current. The output terminal outputs a direct current in accordance with control contents by the control signal. The input terminal of the first switching element is in contact with the first electrode plate. The control terminal of the first switching element is arranged on a side of the rotation shaft and connected to the first wire. The output terminal of the first switching element is arranged on a side of the second electrode plate and connected to the second electrode plate. The input terminal of the second switching element is in contact with the second electrode plate. The control terminal of the second switching element is arranged on the side of the rotation shaft and connected to the second wire. The output terminal of the second switching element is arranged on a side of the third electrode plate and connected to the third electrode plate.

Preferably, the control device includes a polyphase switching element group, a control circuit, and first and second electrode plates. The polyphase switching element group controls a current supplied to a stator. The control circuit controls the polyphase switching element group. The first and second electrode plates are arranged on an end surface of a motor so as to substantially form a U-shape to surround a rotation shaft of the motor. The control circuit is provided on a ceramic substrate arranged in a direction the same as an inplane direction of the first and second electrode plates in a substantially U-shaped notch.

Preferably, the control circuit is resin-molded.

Preferably, the control device further includes a Zener diode. The Zener diode protects the polyphase switching element group against surge. The Zener diode is arranged in the notch.

Preferably, the control device further includes a capacitive element. The capacitive element smoothes a DC voltage from a DC power source and supplies the smoothed DC voltage to the polyphase switching element group. The capacitive element is arranged between the ceramic substrate and the second electrode plate.

Preferably, the control device further includes a field coil control unit. The field coil control unit controls current feed to the field coil different from the stator. The field coil control unit is arranged on the ceramic substrate.

Preferably, a leadframe continuing to the first and second electrode plates from the ceramic substrate and the first and second electrode plates are provided in an identical plane.

In the generator-motor according to the present invention, the control device is arranged on the end surface of the motor in the direction perpendicular to the rotation shaft of the motor. Then, the control device controls drives of the motor.

Therefore, according to the present invention, the generator-motor can be made smaller.

In addition, in the generator-motor according to the present invention, the first switching element constituting each arm is arranged on the first electrode plate arranged in an innermost portion in the end surface of the motor, and the second switching element is arranged on the second electrode plate arranged outside the first electrode plate.

Therefore, according to the present invention, the first and second switching elements can efficiently be cooled by an air flow introduced in the motor.

Moreover, in the generator-motor according to the present invention, the control circuit controlling the first and second switching elements is arranged in a plane where the first, second and third electrode plates are present and in the notch in the first, second and third electrode plates. The wire connecting the control circuit to the first switching element is arranged between the rotation shaft of the motor and the first electrode plate, and the wire connecting the control circuit to the second switching element is arranged between the rotation shaft of the motor and the first electrode plate and between the first electrode plate and the motor.

Therefore, according to the present invention, the wire can be shorter and simplified.

Furthermore, in the generator-motor according to the present invention, the control circuit controlling drive of the motor attaining a function as the generator or the motor is arranged in a direction the same as the inplane direction of the first and second electrode plates arranged on the end surface of the motor. The control circuit is arranged in the substantially U-shaped notch in the first and second electrode plates.

Therefore, according to the present invention, an area occupied by the control circuit can be reduced.

BRIEF DESCRIPTION OF THE DRAWINGS

FIG. 8A is a plan view of an MOS transistor Tr1 shown in FIG. 7.

FIG. 8B is a cross-sectional view of MOS transistor Tr1 and electrode plates 81, 82A.

BEST MODES FOR CARRYING OUT THE INVENTION

Figure 1:
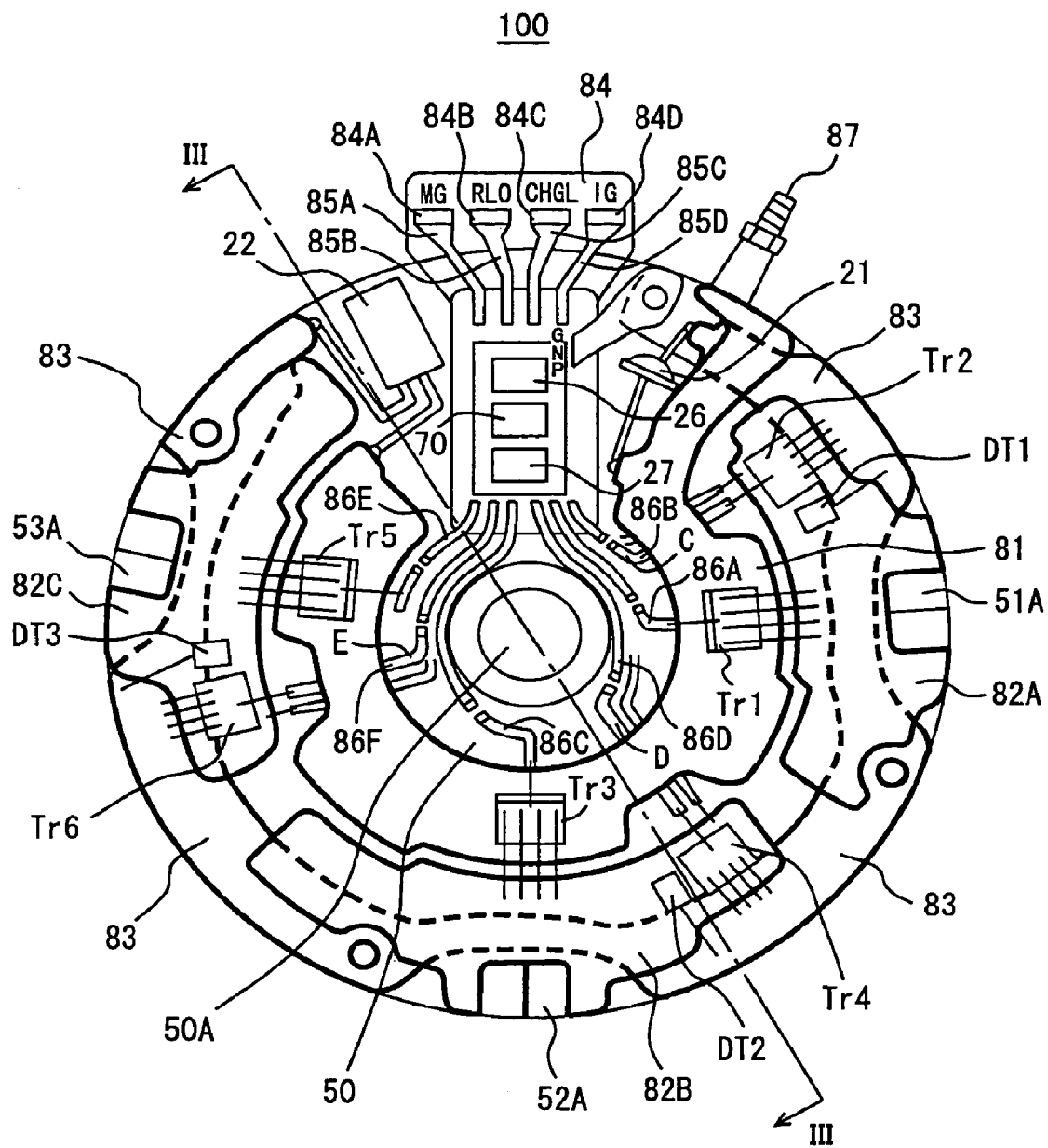
FIG. 1 is a plan view of a generator-motor according to the present invention.

In the following, embodiments of the present invention will be described in detail with reference to the figures. It is noted that the same reference characters refer to the same or corresponding components in the figures.

Referring to FIG. 1, a generator-motor 100 according to the present invention includes Zener diodes 21, DT1 to DT3, MOS transistors Tr1 to Tr6, a power source 26, an MOS driver 27, an alternator 50, a custom IC 70, electrode plates 81, 82A to 82C, 83, a substrate 84, terminals 84A to 84D, and wires 85A to 85D, 86A to 86D.

Electrode plates 81, 82A to 82C, 83 and substrate 84 are formed on an end surface of alternator 50. Electrode plate 81 has a substantial U-shape, and is provided around a rotation shaft 50A of alternator 50. Electrode plates 82A to 82C are provided so as to substantially form a U-shape outside electrode plate 81 to surround electrode plate 81. Electrode plates 82A to 82C are arranged at prescribed intervals from each other. Electrode plate 83 is arranged in a position at a distance from rotation shaft 50A substantially the same as the distance between electrode plates 82A-82C and rotation shaft 50A. A portion of electrode plate 83 is arranged under electrode plates 82A to 82C. Substrate 84 is arranged in a direction the same as an inplane direction of electrode plates 81, 82A to 82C, 83 in a substantially U-shaped notch in electrode plate 81.

MOS transistors Tr1, Tr3, Tr5 are arranged on electrode plate 81, MOS transistor Tr2 and Zener diode DT1 are arranged on electrode plate 82A, MOS transistor Tr4 and Zener diode DT2 are arranged on electrode plate 82B, and MOS transistor Tr6 and Zener diode DT3 are arranged on electrode plate 82C.

MOS transistor Tr1 has the drain connected to electrode plate 81 and the source connected to electrode plate 82A. MOS transistor Tr2 has the drain connected to electrode plate 82A and the source connected to electrode plate 83. Zener diode DT1 has one terminal connected to electrode plate 82A and the other terminal connected to electrode plate 83. Electrode plate 82A is connected to one end 51A of a U-phase coil of alternator 50.

MOS transistor Tr3 has the drain connected to electrode plate 81 and the source connected to electrode plate 82B. MOS transistor Tr4 has the drain connected to electrode plate 82B and the source connected to electrode plate 83. Zener diode DT2 has one terminal connected to electrode plate 82B and the other terminal connected to electrode plate 83. Electrode plate 82B is connected to one end 52A of a V-phase coil of alternator 50.

MOS transistor Tr5 has the drain connected to electrode plate 81 and the source connected to electrode plate 82C. MOS transistor Tr6 has the drain connected to electrode plate 82C and the source connected to electrode plate 83. Zener diode DT3 has one terminal connected to electrode plate 82C and the other terminal connected to electrode plate 83. Electrode plate 82C is connected to one end 53A of a W-phase coil of alternator 50.

Therefore, MOS transistors Tr1, Tr2 are connected in series between electrode plates 81 and 83 through electrode plate 82A. In addition, MOS transistors Tr3, Tr4 are connected in series between electrode plates 81 and 83 through electrode plate 82B. Moreover, MOS transistors Tr5, Tr6 are connected in series between electrode plates 81 and 83 through electrode plate 82C. Electrode plates 82A to 82C are connected to the U-phase coil, the V-phase coil and the W-phase coil of alternator 50, respectively.

MOS transistors Tr1, Tr2 constitute a U-phase arm, MOS transistors Tr3, Tr4 constitute a V-phase arm, and MOS transistors Tr5, Tr6 constitute a W-phase arm. The U-phase arm, the V-phase arm and the W-phase arm are arranged radially from rotation shaft 50A toward an outer circumference in a plane perpendicular to rotation shaft 50A.

Substrate 84 is implemented by a ceramic substrate. Power supply 26, custom IC 70, MOS driver 27, and terminals 84A to 84D are arranged on substrate 84. Power supply 26, custom IC 70, and MOS driver 27 are resin-molded on substrate 84.

Terminal 84A receives a signal M/G and outputs the received signal M/G to custom IC 70 through wire 85A. Terminal 84B receives a signal RLO, and outputs received signal RLO to custom IC 70 through wire 85B. Terminal 84C receives a signal CHGL, and outputs received signal CHGL to custom IC 70 through wire 85C. Terminal 84D receives a DC voltage output from a battery (not shown) and supplies the received DC voltage to power supply 26 through wire 85D.

In wiring from substrate 84 to electrode plates 81, 82A to 82C, wires 86A to 86F are arranged along a circumference surrounding rotation shaft 50A in a space between rotation shaft 50A and electrode plate 81. Then, wire 86B is bent at a point C, and extends under electrode plate 81 (between electrode plate 81 and alternator 50) to reach electrode plate 82A. Wire 86D is bent at a point D, and extends under electrode plate 81 (between electrode plate 81 and alternator 50) to reach electrode plate 82B. In addition, wire 86F is bent at a point E, and extends under electrode plate 81 (between electrode plate 81 and alternator 50) to reach electrode plate 82C.

Here, wires 86A, 86C, 86E constitute "a plurality of first wires," and wires 86B, 86D, 86F constitute "a plurality of second wires."

MOS driver 27 outputs a control signal to the gates of MOS transistors Tr1 to Tr6 through wires 86A to 86F, respectively.

Zener diode 21 is arranged in a space between substrate 84 and electrode plates 81, 83, and connected between electrode plates 81 and 83. A capacitor 22 is arranged in a space between substrate 84 and electrode plates 81, 82C, 83, and connected between electrode plates 81 and 83.

Electrode plate 81 attains a function as a positive bus which will be described later, and has one end connected to a terminal 87. Electrode plate 81 receives a DC voltage output from the battery (not shown) through terminal 87. Electrode plate 83 attains a function as a negative bus which will be described later, and is connected to a ground node.

Figure 2A:
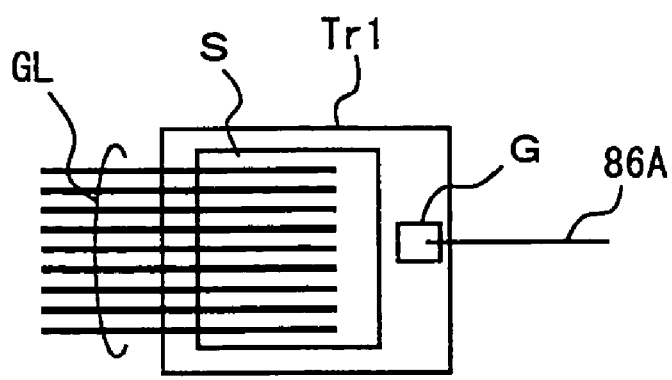
FIG. 2A is a plan view of an MOS transistor Tr1 shown in FIG. 1.
Figure 2B:
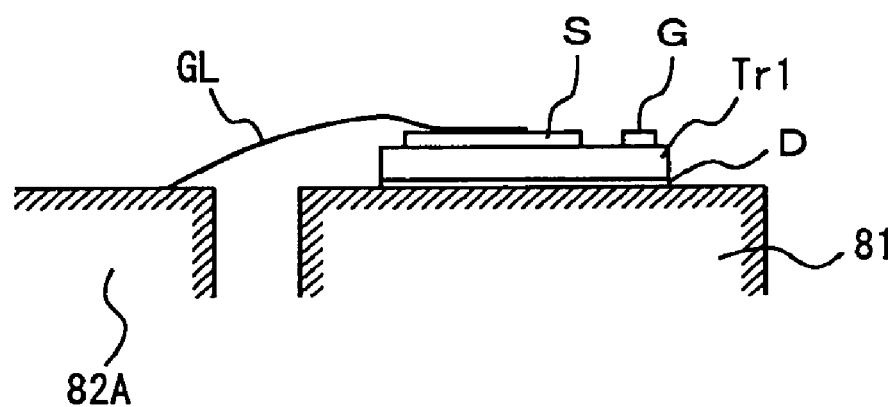
FIG. 2B is a cross-sectional view of MOS transistor Tr1 and electrode plates 81, 82A.

FIG. 2A is a plan view of MOS transistor Tr1, and FIG. 2B is a cross-sectional view of MOS transistor Tr1 and electrode plates 81, 82A. Referring to FIGS. 2A and 2B, MOS transistor Tr1 includes a gate G, a source S and a drain D. Gate G is connected to wire 86A. Source S is arranged adjacent to gate G, and connected to electrode plate 82A by a wire GL. Therefore, in order to facilitate connection of gate G and source S to wire 86A and electrode plate 82A through wire GL, respectively, MOS transistor Tr1 is arranged such that gate G is oriented to a side of rotation shaft 50A and source S is oriented to a side of electrode plate 82A. Drain D is connected to electrode plate 81.

Each of MOS transistors Tr2 to Tr6 includes a gate G, a source S and a drain D in a manner similar to MOS transistor Tr1, and arrangement thereof is also the same.

In a large power element such as MOS transistors Tr1 to Tr6, in many cases, gate G is provided in a central portion of one side along a peripheral portion of the element as described above, so that a length of a signal input line coming from the outside of the element is minimized and so that a pad for an output terminal is made as large as possible.

Therefore, if drain D of MOS transistors Tr1 to Tr6 is provided on a back surface of the element, wire GL from source S is provided such that it is drawn out of a side opposite to the side where gate G is present.

If MOS transistors Tr1 to Tr6 are arranged on electrode plates 81, 82A, 82B, 82C, in order to attain a shorter length of wires 86A, 86B, 86C, 86D, 86E, 86F, GL, MOS transistors Tr1 to Tr6 should be arranged such that gate G is oriented to the side of rotation shaft 50A and source S is oriented to the outer circumferential side.

Then, MOS transistors Tr1, Tr3, Tr5 constitute an upper arm of an inverter controlling a current fed to a coil of each phase of alternator 50, while MOS transistors Tr2, Tr4, Tr6 constitute a lower arm of the inverter controlling a current fed to a coil of each phase of alternator 50. Accordingly, considering a direction of arrangement of MOS transistors Tr1 to Tr6, arranging electrode plate 81 in an innermost portion and arranging electrode plates 82A, 82B, 82C, 83 outside electrode plate 81 is optimal, from a viewpoint of improved efficiency in cooling MOS transistors Tr1 to Tr6 (arranging MOS transistors Tr1 to Tr6 in an inner portion on the end surface of alternator 50 serves to cool MOS transistors Tr1 to Tr6 by a flow of air sucked from outside into alternator 50) or a shorter length of wires 86A, 86B, 86C, 86D, 86E, 86F, GL.

In addition, it is efficient to arrange electrode plate 83 on an outermost side, because electrode plate 83 implements a negative bus and can also be connected to a cover or a frame of alternator 50 for connection to ground.

For these reasons, electrode plate 81 is arranged in the innermost portion, and electrode plates 82A, 82B, 82C, 83 are arranged outside electrode plate 81.

Figure 3:
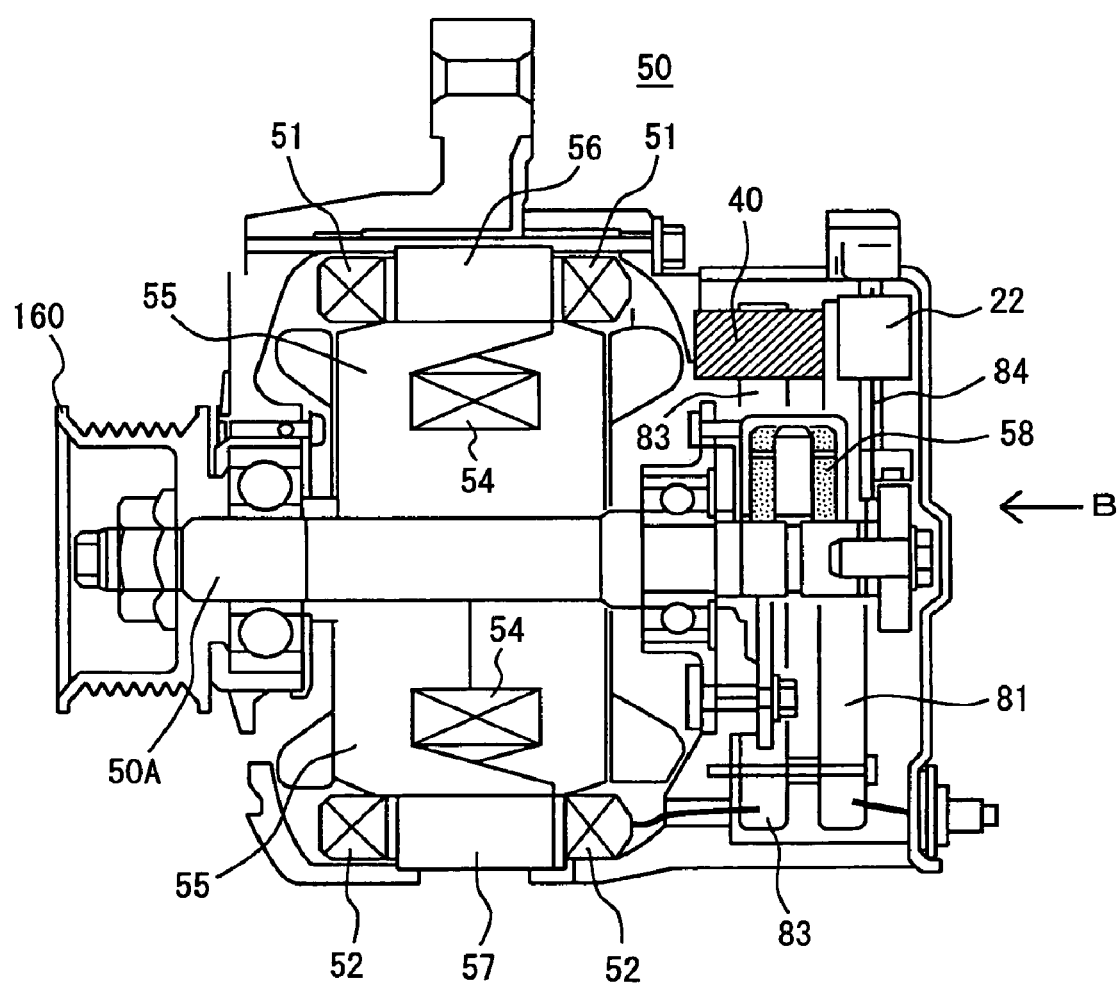
FIG. 3 is a cross-sectional view along the line III-III shown in FIG. 1.

FIG. 3 shows a cross-sectional structure of alternator 50, viewed from a cross-section along the line III-III shown in FIG. 1. Referring to FIG. 3, a rotor 55 is fixed to rotation shaft 50A, and a rotor coil 54 is wound around rotor 55. Stators 56, 57 are fixed on an outer side of rotor 55, a U-phase coil 51 is wound around stator 56, and V-phase coil 52 is wound around stator 57. In FIG. 3, the stator having a W-phase coil wound is not shown.

Rotation shaft 50A has one end connected to a pulley 160, which transmits a torque generated by alternator 50 to a crank shaft of the engine or auxiliary machinery through a belt and in turn transmits the rotation power of the crank shaft of the engine to rotation shaft 50A.

On the other end on a side opposite to one end of rotation shaft 50A connected to pulley 160, electrode plates 81, 83 are arranged so as to surround rotation shaft 50A. A brush 58 is arranged so as to be in contact with rotation shaft 50A. Substrate 84 is provided above rotation shaft 50A, and capacitor 22 is arranged in front of substrate 84.

An MOS transistor 40 is provided on a side opposite to capacitor 22, with electrode plate 81 lying therebetween. MOS transistor 40 has the drain connected to electrode plate 81 and the source connected to rotor coil 54. When alternator 50 generates electric power, a power generation amount is determined depending on a rotor current flowing in rotor coil 54. Therefore, MOS transistor 40 feeds rotor coil 54 with a rotor current necessary for alternator 50 to generate an instructed amount of electric power.

In this manner, MOS transistor 40 controlling the rotor current determining a power generation amount of alternator 50 is arranged on a back side of substrate 84 when viewed from a direction B.

Figure 4:
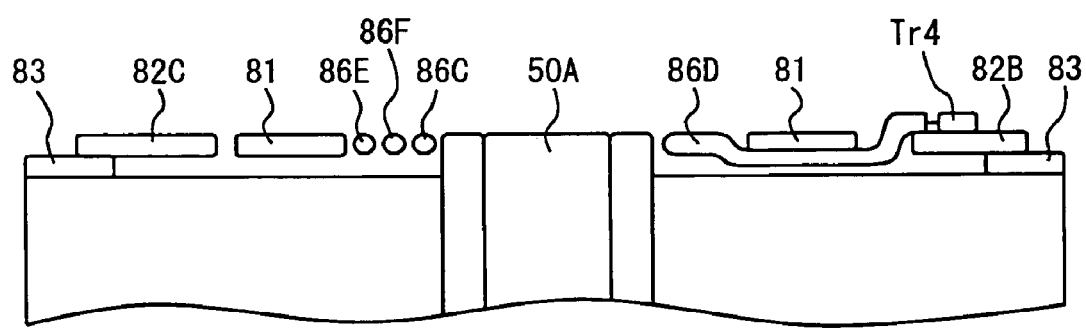
FIG. 4 is another cross-sectional view along the line III-III shown in FIG. 1.

FIG. 4 is a cross-sectional view showing an arrangement of electrode plates 81, 82B, 82C, 83 and the like viewed from the cross-section along the line III-III shown in FIG. 1. Referring to FIG. 4, wires 86C, 86E, 86F are arranged on the left of rotation shaft 50A, and electrode plates 81, 82C, 83 are successively arranged toward an outer circumferential side of wires 86C, 86E, 86F. Here, wires 86C, 86E, 86F and electrode plates 81, 82C are arranged in an identical plane. Electrode plate 83 is arranged below wires 86C, 86E, 86F and electrode plates 81, 82C, and electrode plate 83 partially overlaps with electrode plate 82C.

On the right of rotation shaft 50A, wire 86D and electrode plates 81, 82B, 83 are successively arranged. A portion of wire 86D and electrode plates 81, 82B are arranged in an identical plane. Electrode plate 83 is arranged below a portion of wire 86D and electrode plates 81, 82B, and electrode plate 83 partially overlaps with electrode plate 82B. MOS transistor Tr4 is arranged on electrode plate 82B. Wire 86D is arranged between rotation shaft 50A and electrode plate 81 so as to surround rotation shaft 50A until it reaches point D (see FIG. 1). After wire 86D is bent at point D, it extends under electrode plate 81 and is connected to the gate of MOS transistor Tr4.

In this manner, electrode plate 83 is arranged below the plane where electrode plates 81, 82B, 82C are arranged, that is, on a side closer to the alternator.

Figure 5:
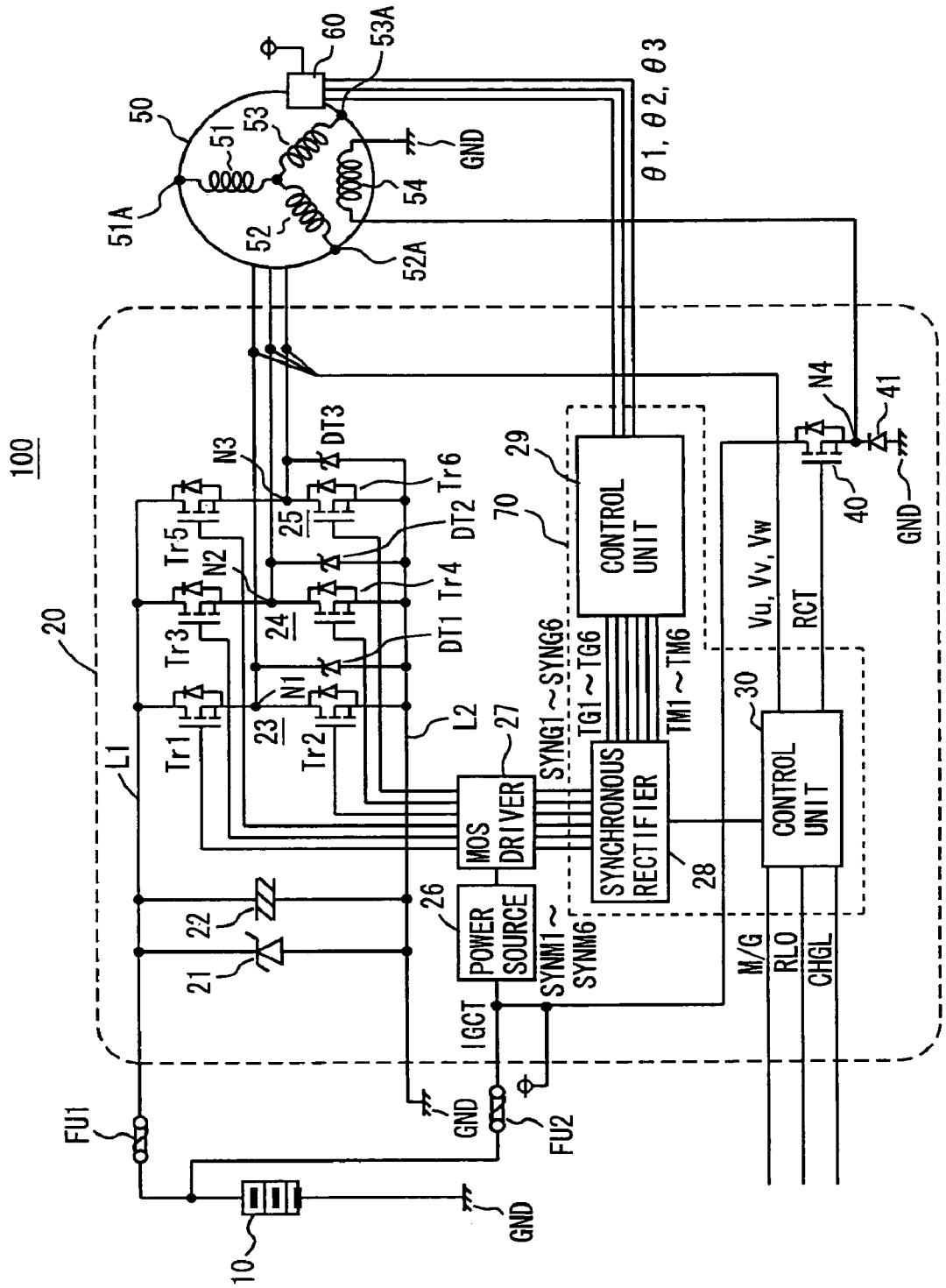
FIG. 5 is a circuit block diagram of the generator-motor and a battery shown in FIG. 1.

FIG. 5 is a circuit block diagram of generator-motor 100 and a battery 10. A control circuit 20 includes Zener diode 21 arranged between substrate 84 and electrode plates 81, 83, capacitor 22 arranged between substrate 84 and electrode plates 81, 82C, 83, MOS transistors Tr1, Tr3, Tr5 arranged on electrode plate 81, MOS transistors Tr2, Tr4, Tr6 arranged on electrode plates 82A to 82C respectively, power source 26 arranged on substrate 84, MOS driver 27, custom IC 70, MOS transistor 40, and a diode 41.

MOS transistors Tr1, Tr2 constitute a U-phase arm 23, MOS transistors Tr3, Tr4 constitute a V-phase arm 24, and MOS transistors Tr5, Tr6 constitute a W-phase arm 25.

Custom IC 70 is constituted of a synchronous rectifier 28 and control units 29, 30. A rotation angle sensor 60 is contained in alternator 50.

Alternator 50 includes U-phase coil 51, V-phase coil 52, W-phase coil 53, and rotor coil 54. U-phase coil 51 has one end 51A connected to a node N1 between MOS transistor Tr1 and MOS transistor Tr2. V-phase coil 52 has one end 52A connected to a node N2 between MOS transistor Tr3 and MOS transistor Tr4. W-phase coil 53 has one end 53A connected to a node N3 between MOS transistor Tr5 and MOS transistor Tr6.

A fuse FU1 is connected between a positive electrode of battery 10 and control circuit 20. That is, fuse FU1 is arranged on a side of battery 10, rather than a side of Zener diode 21. In this manner, by arranging fuse FU1 on the side of battery 10 rather than the side of Zener diode 21, detection of overcurrent is no longer necessary and control circuit 20 can be reduced in size. A fuse FU2 is connected between the positive electrode of battery 10 and power source 26.

Zener diode 21 and capacitor 22 are connected in parallel between a positive bus L1 and a negative bus L2.

U-phase arm 23, V-phase arm 24, and W-phase arm 25 are connected in parallel between positive bus L1 and negative bus L2. Zener diode DT1 is connected in parallel to MOS transistor Tr2 between node N1 and negative bus L2. Zener diode DT2 is connected in parallel to MOS transistor Tr4 between node N2 and negative bus L2. Zener diode DT3 is connected in parallel to MOS transistor Tr6 between node N3 and negative bus L2.

MOS transistor 40 is connected between the positive electrode of battery 10 and a node N4. Diode 41 is connected between node N4 and a ground node GND.

Here, diodes connected in parallel to MOS transistors Tr1 to Tr6, 40 respectively are parasitic diodes formed between MOS transistors Tr1 to Tr6, 40 and a semiconductor substrate respectively.

Battery 10 outputs, for example, a DC voltage of 12V. Zener diode 21 absorbs a surge voltage generated between positive bus L1 and negative bus L2. In other words, Zener diode 21 absorbs a surge voltage when the surge voltage not smaller than a prescribed voltage level is applied between positive bus L1 and negative bus L2, and lowers the DC voltage applied to capacitor 22 and MOS transistors Tr1 to Tr6 to a level not larger than the prescribed voltage level. Therefore, it is not necessary to secure large capacitance of capacitor 22 and large size of MOS transistors Tr1 to Tr6, considering the surge voltage. As a result, capacitor 22 and MOS transistors Tr1 to Tr6 can be reduced in size.

Capacitor 22 smoothes an input DC voltage, and supplies the smoothed DC voltage to U-phase arm 23, V-phase arm 24, and W-phase arm 25. MOS transistors Tr1 to Tr6 receive a control signal from MOS driver 27 at the gates, and are turned on/off in accordance with the received control signal. Then, MOS transistors Tr1 to Tr6 switch the direct current flowing in U-phase coil 51, V-phase coil 52, and W-phase coil 53 of alternator 50 by the DC voltage supplied from capacitor 22, so as to drive alternator 50. In addition, MOS transistors Tr1 to Tr6 convert an AC voltage generated by U-phase coil 51, V-phase coil 52, and W-phase coil 53 of alternator 50 to the DC voltage in accordance with the control signal from MOS driver 27, so as to charge battery 10.

Zener diodes DT1 to DT3 prevent application of overvoltage to MOS transistors Tr2, Tr4, Tr6 when U-phase coil 51, V-phase coil 52, and W-phase coil 53 of alternator 50 generate electric power, respectively. In other words, Zener diodes DT1 to DT3 protect the lower arm of U-phase arm 23, V-phase arm 24, and W-phase arm 25 when alternator 50 is in a power generation mode.

Power source 26 receives the DC voltage output from battery 10 through fuse FU2, and supplies the received DC voltage to MOS driver 27 as two DC voltages having different voltage levels. More specifically, power source 26 generates, for example, a DC voltage of 5V based on the DC voltage of 12V received from battery 10, and supplies to MOS driver 27 the generated DC voltage of 5V and the DC voltage of 12V received from battery 10.

MOS driver 27 is driven by the DC voltages of 5V and 12V supplied from power source 26. Then, MOS driver 27 generates a control signal for turning on/off MOS transistors Tr1 to Tr6 in synchronization with a synchronization signal from synchronous rectifier 28, and outputs the generated control signal to the gates of MOS transistors Tr1 to Tr6. More specifically, MOS driver 27 generates the control signal for turning on/off MOS transistors Tr1 to Tr6 in the power generation mode of alternator 50 based on synchronization signals SYNG1 to SYNG6 from synchronous rectifier 28, and generates the control signal for turning on/off MOS transistors Tr1 to Tr6 in a drive mode of alternator 50 based on synchronization signals SYNM1 to SYNM6 from synchronous rectifier 28.

Upon receiving a signal GS from control unit 30, synchronous rectifier 28 generates synchronization signals SYNG1 to SYNG6 based on timing signals TG1 to TG6 from control unit 29, and outputs generated synchronization signals SYNG1 to SYNG6 to MOS driver 27. In addition, upon receiving a signal MS from control unit 30, synchronous rectifier 28 generates synchronization signals SYNM1 to SYNM6 based on timing signals TM1 to TM6 from control unit 29, and outputs generated synchronization signals SYNM1 to SYNM6 to MOS driver 27.

Control unit 29 receives angles $\theta 1$, $\theta 2$, $\theta 3$ from rotation angle sensor 60, and detects the number of revolutions MRN of rotor 55 included in alternator 50 based on received angles $\theta 1$, $\theta 2$, $\theta 3$.

Angle $\theta 1$ represents an angle between a direction of magnetic force generated by U-phase coil 51 and a direction of magnetic force generated by rotor coil 54. Angle $\theta 2$ represents an angle between a direction of magnetic force generated by V-phase coil 52 and a direction of magnetic force generated by rotor coil 54. Angle $\theta 3$ represents an angle between a direction of magnetic force generated by W-phase coil 53 and a direction of magnetic force generated by rotor coil 54. Angles $\theta 1$, $\theta 2$, $\theta 3$ periodically vary in a range from 0° to 360°. Therefore, control unit 29 detects the number of revolutions that periodically varies in a prescribed time period in a range from 0° to 360°, so as to obtain the number of revolutions MRN.

Then, control unit 29 detects a timing of voltages Vui, Vvi, Vwi induced in U-phase coil 51, V-phase coil 52, and W-phase coil 53 of alternator 50 based on angles $\theta 1$, $\theta 2$, $\theta 3$, and generates timing signals TG1 to TG6 indicating a timing of turn-on/off of MOS transistors Tr1 to Tr6 for converting voltages Vui, Vvi, Vwi induced in U-phase coil 51, V-phase coil 52, and W-phase coil 53 to DC voltages based on that detected timing.

In addition, control unit 29 generates timing signals TM1 to TM6 indicating a timing of turn-on/off of MOS transistors Tr1 to Tr6 for causing alternator 50 to operate as a drive motor, based on angles $\theta 1$, $\theta 2$, $\theta 3$ and the detected number of revolutions MRN.

Then, control unit 29 outputs generated timing signals TG1 to TG6, TM1 to TM6 to synchronous rectifier 28.

Control unit 30 receives signal M/G, signal RLO, and signal CHGL from an externally provided eco-run ECU (Electrical Control unit) (which will be described later). In addition, control unit 30 receives voltages Vu, Vv, Vw applied to U-phase coil 51, V-phase coil 52, and W-phase coil 53 of alternator 50.

Control unit 30 determines whether alternator 50 is to operate as a generator or a drive motor, based on signal M/G. When control unit 30 determines that alternator 50 is to operate as the generator, control unit 30 generates and outputs signal GS to synchronous rectifier 28. On the other hand, when control unit 30 determines that alternator 50 is to operate as the drive motor, control unit 30 determines a manner of current feed to U-phase coil 51, V-phase coil 52, and W-phase coil 53 based on voltages Vu, Vv, Vw, and generates signal MS for driving alternator 50 in accordance with the determined current feeding manner, for output to synchronous rectifier 28.

In addition, control unit 30 calculates a rotor current in order for alternator 50 to generate an instructed amount of electric power, based on signal RLO. Control unit 30 generates a signal RCT for feeding the calculated rotor current to rotor coil 54, and outputs the generated signal to the gate of MOS transistor 40.

Moreover, control unit 30 provides temperature information of MOS transistor 40 to outside in a signal format, based on signal CHGL.

MOS transistor 40 sets the rotor current supplied from battery 10 to rotor coil 54 to a prescribed value, based on signal RCT from control unit 30. Here, diode 41 serves as a free wheel diode in controlling turning-off of the rotor.

Alternator 50 operates either as the drive motor or as the generator. Alternator 50 generates a prescribed torque under the control of control circuit 20 at the start of the engine in the drive mode where it operates as the drive motor, and starts the engine using the generated prescribed torque. In addition, alternator 50 drives auxiliary machinery using the generated torque during a period except for start of the engine.

Moreover, alternator 50 generates an AC voltage in accordance with the rotor current flowing in rotor coil 54 in the power generation mode where it operates as the generator, and supplies the generated AC voltage to U-phase arm 23, V-phase arm 24, and W-phase arm 25.

Rotation angle sensor 60 detects angles $\theta 1$, $\theta 2$, $\theta 3$, and outputs detected angles $\theta 1$, $\theta 2$, $\theta 3$ to control unit 29.

An overall operation in generator-motor 100 will now be described. Control unit 30 determines whether alternator 50 is to operate as a generator or a drive motor, based on signal M/G from the eco-run ECU. When control unit 30 determines that alternator 50 is to operate as the generator, control unit 30 generates and outputs signal GS to synchronous rectifier 28. Control unit 30 generates signal RCT based on signal RLO from the eco-run ECU, and outputs the generated signal to the gate of MOS transistor 40.

Then, MOS transistor 40 switches the rotor current supplied from battery 10 to rotor coil 54 in response to signal RCT. Rotor 55 of alternator 50 is rotated by the rotation power of the engine. Then, alternator 50 generates a designated amount of electric power and supplies the electric power to U-phase arm 23, V-phase arm 24, and W-phase arm 25.

On the other hand, upon receiving angles $\theta 1$, $\theta 2$, $\theta 3$ from rotation angle sensor 60, control unit 29 generates timing signals TG1 to TG6, TM1 to TM6 with the method described above based on received angles $\theta 1$, $\theta 2$, $\theta 3$, and outputs the generated timing signal to synchronous rectifier 28.

Synchronous rectifier 28 generates synchronization signals SYNG1 to SYNG6 in synchronization with timing signals TG1 to TG6 based on signal GS from control unit 30, and outputs the same to MOS driver 27. MOS driver 27 generates the control signal for turning on/off MOS transistors Tr1 to Tr6 in synchronization with synchronization signals SYNG1 to SYNG6, and outputs the control signal to the gates of MOS transistors Tr1 to Tr6.

Then, MOS transistors Tr1 to Tr6 are turned on/off by the control signal from MOS driver 27, and converts the AC voltage generated by alternator 50 to the DC voltage, so as to charge battery 10.

Here, Zener diodes DT1 to DT3 absorb a surge voltage even if the surge voltage is superposed on the AC voltage generated by alternator 50. In other words, Zener diodes DT1 to DT3 prevent application of a voltage exceeding a withstand voltage to MOS transistors Tr2, Tr4, Tr6. In addition, Zener diode 21 absorbs a surge voltage even if the surge voltage is superposed on the DC voltage between positive bus L1 and negative bus L2. In other words, Zener diode 21 prevents application of a voltage exceeding a withstand voltage to MOS transistors Tr1, Tr3, Tr5.

When control unit 30 determines that alternator 50 is to be driven as the drive motor based on signal M/G, control unit 30 determines a manner of current feed to U-phase arm 23, V-phase arm 24, and W-phase arm 25 based on voltages Vu, Vv, Vw, and generates signal MS for driving alternator 50 in accordance with the determined current feeding manner, for output to synchronous rectifier 28.

Upon receiving angles θ1, θ2, θ3 from rotation angle sensor 60, control unit 29 generates timing signals TG1 to TG6, TM1 to TM6 with the method described above based on received angles θ1, θ2, θ3, and outputs the generated timing signal to synchronous rectifier 28.

Synchronous rectifier 28 generates synchronization signals SYNM1 to SYNM6 in synchronization with timing signals TM1 to TM6 based on signal MS from control unit 30, and outputs the same to MOS driver 27. MOS driver 27 generates the control signal for turning on/off MOS transistors Tr1 to Tr6 in synchronization with synchronization signals SYNM1 to SYNM6, and outputs the same to the gates of MOS transistors Tr1 to Tr6.

Then, MOS transistors Tr1 to Tr6 are turned on/off by the control signal from MOS driver 27, and switches the current supplied to U-phase arm 23, V-phase arm 24, and W-phase arm 25 of alternator 50 from battery 10 so as to drive alternator 50 as the drive motor. In this manner, alternator 50 supplies a prescribed torque to a crank shaft of the engine at the start of the engine. In addition, alternator 50 supplies a prescribed torque to the auxiliary machinery.

Here, Zener diode 21 absorbs a surge voltage generated between positive bus L1 and negative bus L2 by turning-on/off of MOS transistors Tr1 to Tr6. In other words, Zener diode 21 prevents application of a voltage exceeding a withstand voltage to MOS transistors Tr1, Tr3, Tr5. In addition, Zener diodes DT1 to DT3 absorb a surge voltage even if MOS transistors Tr1, Tr3, Tr5 are turned off and the surge voltage is applied to MOS transistors Tr2, Tr4, Tr6. In other words, Zener diodes DT1 to DT3 prevent application of a voltage exceeding a withstand voltage to MOS transistors Tr2, Tr4, Tr6.

As described above, MOS transistors Tr1 to Tr6 are arranged on electrode plates 81, 82A to 82C provided on the end surface of alternator 50. Such an arrangement is allowed because application of overvoltage to MOS transistors Tr1 to Tr6 is prevented and MOS transistors Tr1 to Tr6 are reduced in size by providing Zener diodes 21, DT1 to DT3. In particular, as one Zener diode 21 protects three MOS transistors Tr1, Tr3, Tr5, Zener diode 21 protecting three MOS transistors Tr1, Tr3, Tr5 can be arranged utilizing a space between substrate 84 and electrode plates 81, 83.

In addition, as Zener diode 21 also prevents application of overvoltage to capacitor 22, a capacitance of capacitor 22 can be reduced. Consequently, capacitor 22 can be arranged in a space between substrate 84 and electrode plates 81, 82C, 83.

By virtue of these factors, overall control circuit 20 is reduced in size, and control circuit 20 can be arranged on the end surface of alternator 50. In other words, control circuit 20 can be arranged in a plane perpendicular to rotation shaft 50A, instead of in the longitudinal direction of rotation shaft 50A of alternator 50. As a result, an area occupied by control circuit 20 can be reduced.

Electrode plate 81 is arranged in the innermost portion, and electrode plates 82A, 82B, 82C, 83 are arranged outside electrode plate 81. Each of MOS transistors Tr1 to Tr6 is arranged on electrode plates 81, 82A, 82B, 82C such that gate G is oriented to the side of rotation shaft 50A and source S is oriented to the outer circumferential side.

Therefore, MOS transistors Tr1 to Tr6 are arranged in the inner portion on the end surface of alternator 50, so that efficiency in cooling MOS transistors Tr1 to Tr6 by means of a flow of air sucked from outside into alternator 50 can be enhanced. In addition, wires 86A, 86B, 86C, 86D, 86E, 86F can have shorter length and be simplified.

Figure 6:
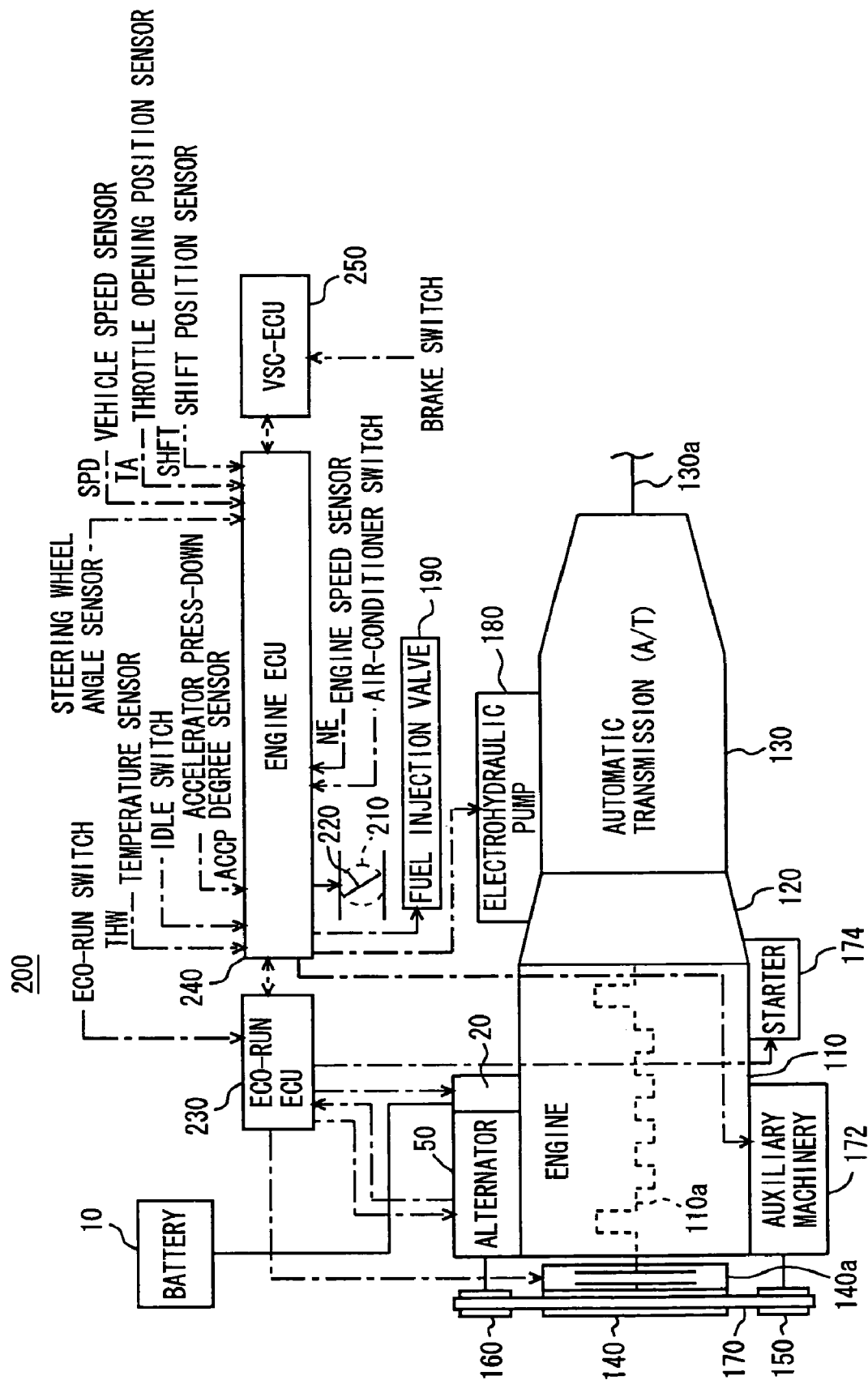
FIG. 6 is a schematic block diagram of an engine system including the generator-motor shown in FIG. 1.

FIG. 6 shows a block diagram of an engine system 200 including generator-motor 100. Referring to FIG. 6, engine system 200 includes battery 10, control circuit 20, alternator 50, an engine 110, a torque converter 120, an automatic transmission 130, pulleys 140, 150, 160, an electromagnetic clutch 140a, a belt 170, auxiliary machinery 172, a starter 174, an electrohydraulic pump 180, a fuel injection valve 190, an electric motor 210, a throttle valve 220, an eco-run ECU 230, an engine ECU 240, and a VSC (Vehicle Stability Control)-ECU 250.

Alternator 50 is arranged proximate to engine 110. Control circuit 20 is arranged on the end surface of alternator 50, as described above.

Engine 110 is started by alternator 50 or starter 174, and generates a prescribed output power. More specifically, engine 110 is started by alternator 50 at a start after stop in accordance with an economy running system (also referred to as "eco-run", "idle stop", "idling stop"), while engine 110 is started by starter 174 at a start using an ignition key. Engine 110 provides the generated output power from a crank shaft 110a to torque converter 120 or pulley 140.

Torque converter 120 transmits the rotation power of engine 110 from crank shaft 110a to automatic transmission 130. Automatic transmission 130 attains a function of automatic transmission control, sets the torque from torque converter 120 to a torque in accordance with transmission control, and provides the torque to an output shaft 130a.

Pulley 140 contains electromagnetic clutch 140a, through which pulley 140 is connected to crank shaft 110a of engine 110. Pulley 140 operates together with pulleys 150, 160 via belt 170.

Electromagnetic clutch 140a is turned on/off under the control of eco-run ECU 230, and connects/disconnects pulley 140 to/from crank shaft 110a. Belt 170 links pulleys 140, 150, 160 with one another. Pulley 150 is connected to a rotation shaft of auxiliary machinery 172.

Pulley 160 is connected to rotation shaft 50A of alternator 50, and turned by crank shaft 10a of engine 110 or alternator 50.

Auxiliary machinery 172 is implemented by one or more of a compressor for air-conditioner, a power steering pump, and an engine-cooling water pump. Auxiliary machinery 172 receives the output power from alternator 50 through pulley 160, belt 170 and pulley 150, and is driven by the received output power.

Alternator 50 is driven by control circuit 20. Alternator 50 receives the rotation power of crank shaft 110*a* of engine 110 through pulley 140, belt 170 and pulley 160, and converts the received rotation power to electric energy. In other words, alternator 50 generates electric power by the rotation power of crank shaft 110*a*. Here, alternator 50 generates electric power in the following two cases. That is, alternator 50 generates electric power when it receives the rotation power of crank shaft 110*a* produced by drive of engine 110 in a normal running state of a hybrid vehicle equipped with engine system 200. In addition, though engine 110 is not driven, alternator 50 generates electric power upon receiving the rotation power transmitted to crank shaft 110*a* from driving wheels in deceleration of the hybrid vehicle.

Alternator 50 is driven by control circuit 20, and outputs a prescribed output power to pulley 160. The prescribed output power is transmitted to crank shaft 110*a* of engine 110 through belt 170 and pulley 140 when engine 110 is started, or it is transmitted to auxiliary machinery 172 through belt 170 and pulley 150 in driving auxiliary machinery 172.

Battery 10 supplies the DC voltage of 12V to control circuit 20, as described above.

Control circuit 20 converts the DC voltage from battery 10 to the AC voltage under the control of eco-run ECU 230 as described above, and drives alternator 50 using the obtained AC voltage. In addition, control circuit 20 converts the AC voltage generated by alternator 50 to the DC voltage under the control of eco-run ECU 230, and charges battery 10 using the obtained DC voltage.

Starter 174 starts engine 110 under the control of eco-run ECU 230. Electrohydraulic pump 180 is contained in automatic transmission 130, and supplies a hydraulic fluid to a hydraulic control unit provided in automatic transmission 130 under the control of engine ECU 240. The hydraulic fluid serves to adjust an actuation state of a clutch, a brake and a one-way clutch within automatic transmission 130 by means of a control valve in the hydraulic control unit, so as to switch a shift state as required.

Eco-run ECU 230 serves for switching on/off of electromagnetic clutch 140*a*, mode control of alternator 50 and control circuit 20, control of starter 174, and control of an amount of power storage in battery 10. Here, the mode control of alternator 50 and control circuit 20 refers to control of the power generation mode in which alternator 50 attains a function as the generator and the drive mode in which alternator 50 attains a function as the drive motor. Eco-run ECU 230 generates signal M/G for controlling the power generation mode and the drive mode, and outputs the signal to control circuit 20. Here, a control line from eco-run ECU 230 to battery 10 is not shown.

In addition, eco-run ECU 230 detects the number of revolutions MRN based on angles θ1, θ2, θ3 from rotation angle sensor 60 contained in alternator 50, whether or not the eco-run system has been started by a driver from an eco-run switch, and other data.

Fuel injection valve 190 controls injection of a fuel under the control of engine ECU 240. Electric motor 210 controls an opening position of throttle valve 220 under the control of engine ECU 240. Throttle valve 220 is set to a prescribed opening position by electric motor 210.

Engine ECU 240 serves for control of turn-on/off of auxiliary machinery 172 except for the engine-cooling water pump, control of drive of electrohydraulic pump 180, transmission control of automatic transmission 130, control of injection of a fuel by fuel injection valve 190, control of an opening position of throttle valve 220 by electric motor 210, and other engine control.

In addition, engine ECU 240 detects a temperature of engine-cooling water from a temperature sensor, whether or not an accelerator pedal has been pressed down from an idle switch, a degree of press-down of the accelerator from an accelerator press-down degree sensor, a steering wheel angle from a steering wheel angle sensor, a vehicle speed from a vehicle speed sensor, a throttle opening position from a throttle opening position sensor, a shift position from a shift position sensor, the number of revolutions of the engine from an engine speed sensor, whether or not an operation to turn on/off of the air-conditioner has been performed from a switch of the air-conditioner, and other data.

VSC-ECU 250 detects whether or not a brake pedal has been pressed down from a brake switch, and other data.

Eco-run ECU 230, engine ECU 240 and VSC-ECU 250 mainly include a microcomputer, in which a CPU (Central Processing Unit) executes a necessary operation in accordance with a program written in an internal ROM (Read Only Memory) and a variety of types of control are applied based on a result of the operation. The result of the operation and detected data can be communicated as data, among eco-run ECU 230, engine ECU 240 and VSC-ECU 250. Therefore, the data can be exchanged as required, and control can be applied in a cooperative manner.

An operation of engine system 200 will now be described. Eco-run ECU 230 is responsible for an automatic stop processing, a motor drive processing during engine stop, an automatic start processing, a motor-driven start processing, a motor control processing during running, and a motor control processing during deceleration.

First, the automatic stop processing will be described. Engine ECU 240 receives an engine-cooling water temperature THW, an idle switch, a battery voltage, a brake switch, a vehicle speed SPD, and the like. Then, engine ECU 240 detects whether or not the accelerator pedal has been pressed down from the idle switch, and whether or not the brake pedal has been pressed down from the brake switch.

When the automatic stop processing is started, engine-cooling water temperature THW, whether or not the accelerator pedal has been pressed down, a voltage of battery 10, whether or not the brake pedal has been pressed down, vehicle speed SPD, and the like are read in a work area of an RAM (Random Access Memory) within eco-run ECU 230. Eco-run ECU 230 determines whether or not a condition for automatic stop is satisfied based on such data. Here, the condition for automatic stop is satisfied if all of the following conditions are met: for example, engine-cooling water temperature THW is within a range from a lower limit to an upper limit; vehicle speed SPD is 0 km/h; and the like.

When eco-run ECU 230 determines that the condition for automatic stop is satisfied, eco-run ECU 230 performs an engine stop processing. More specifically, eco-run ECU 230 instructs cutting-off of fuel supply to engine ECU 240. Engine ECU 240 controls fuel injection valve 190 to stop fuel injection in response to the instruction of cutting-off of fuel supply, so as to completely close throttle valve 220. In this manner, fuel injection valve 190 stops fuel injection, combustion in a combustion chamber of engine 110 is stopped, and the operation of engine 110 is stopped.

The motor drive processing during engine stop will now be described. When the motor drive processing during engine stop is started, eco-run ECU 230 controls control circuit 20 so as to turn on electromagnetic clutch 140*a*, to set the number of revolutions of alternator 50 to the target number of revolutions during idle, and to drive alternator 50. More specifically, eco-run ECU 230 outputs signal M/G for causing alternator 50 to operate as the drive motor to control circuit 20. Then, control circuit 20 causes alternator 50 to operate as the drive motor with the method described above based on signal M/G from eco-run ECU 230, and drives alternator 50 such that the number of revolutions thereof attains the target number of revolutions during idle. In this manner, rotation shaft 50A of alternator 50 rotates and pulley 160 also rotates.

The rotation power transmitted to pulley 160 is transmitted to crank shaft 110a through belt 170 and pulley 140, so that crank shaft 110a rotates at the target number of revolutions during idle. Then, eco-run ECU 230 confirms that a state in which engine 110 rotates at the target number of revolutions during idle is maintained for a certain period of time.

In this manner, while engine 110 is stopped, the output power from alternator 50 rotates engine 110 at the number of revolutions equivalent to that during idle. Accordingly, a pressure in a cylinder of engine 110 having throttle valve 220 completely closed can sufficiently be lowered. In addition, a difference of a load torque between operation steps of engine 110 in which combustion does not take place is made smaller, and variation in the torque during rotation can be reduced. As a result, rocking at the time of stop can be suppressed, and a driver will not feel uncomfortable when engine 110 automatically stops.

Thereafter, eco-run ECU 230 determines whether or not a request to drive auxiliary machinery 172 has been issued. If eco-run ECU 230 determines that the request to drive auxiliary machinery 172 has been issued, it turns off electromagnetic clutch 140a, and sets alternator 50 to the drive mode. In this case as well, alternator 50 is caused to rotate at the target number of revolutions during idle by the operation described above, and its rotation power is transmitted to auxiliary machinery 172 through pulley 160, belt 170 and pulley 150.

The compressor for the air-conditioner and the power steering pump are thus driven. Here, as electromagnetic clutch 140a is turned off, crank shaft 110a of engine 110 does not rotate, thereby preventing waste of electric power and improving fuel efficiency.

In this manner, eco-run ECU 230 drives alternator 50 while engine 110 is stopped and rotates crank shaft 110a of engine 110 so as to perform a processing for reducing rocking, or drives auxiliary machinery 172.

The automatic start processing will now be described. When the automatic start processing is started, eco-run ECU 230 determines whether or not a condition for automatic start is satisfied by reading data the same as that read for the automatic stop processing. More specifically, eco-run ECU 230 determines that the condition for automatic start is satisfied if one of the conditions for automatic start is not satisfied.

Then, eco-run ECU 230 stops the motor drive processing during engine stop when it determines that the condition for automatic start is met. The automatic start processing is thus completed.

The motor-driven start processing will now be described. When the motor-driven start processing is started, eco-run ECU 230 issues an instruction to prohibit turn-on of the air-conditioner to engine ECU 240. Then, engine ECU 240 stops driving of the air-conditioner if the air-conditioner has been turned on. Load imposed in alternator 50 can thus be mitigated.

Then, eco-run ECU 230 turns on electromagnetic clutch 140a, and sets alternator 50 to the drive mode. Here, with the same operation as described above, the rotation power of alternator 50 is transmitted to crank shaft 110a through pulley 160, belt 170 and pulley 140, so that crank shaft 110a is rotated at the target number of revolutions during idle.

Thereafter, eco-run ECU 230 determines whether or not the number of revolutions of engine 110 attains the target number of revolutions during idle. If the number of revolutions of engine 110 attains the target number of revolutions during idle, eco-run ECU 230 issues an instruction to start fuel injection to engine ECU 240. Then, engine ECU 240 controls fuel injection valve 190 so as to inject fuel, and fuel injection valve 190 starts injection of the fuel. Engine 110 is thus started and starts its operation.

Here, engine 110 is quickly started because the fuel injection is started after the target number of revolutions during idle has been attained. In addition, engine 110 attains stable number of revolutions in a short period of time. Moreover, as crank shaft 110a of engine 110 is rotated by the output power from alternator 50 until fuel injection is started, the vehicle can start to move by a creep force generated by torque converter 120 in a non-lockup state, provided that the torque output from alternator 50 is sufficiently high.

In this manner, in the motor-driven start processing, alternator 50 is driven in the drive mode.

The motor control processing during running will now be described. When the motor control processing during running is started, eco-run ECU 230 determines whether or not start of engine 110 has been completed by the motor-driven start processing. If eco-run ECU 230 determines that the start of engine 110 has been completed, the motor-driven start processing is stopped. Then, eco-run ECU 230 issues an instruction to permit turning-on of the air-conditioner to engine ECU 240. In response, engine ECU 240 makes a switch such that the compressor for the air-conditioner operates together with rotation of pulley 150 if the air conditioner has been turned on, so as to allow drive of the air-conditioner.

Thereafter, eco-run ECU 230 determines whether or not the vehicle is in deceleration. Here, deceleration refers, for example, to a state in which the accelerator pedal has completely returned to its original position during running, that is, the idle switch has been turned on during running. Therefore, eco-run ECU 230 determines that the vehicle is not in deceleration if the idle switch is turned off Then, eco-run ECU 230 turns on electromagnetic clutch 140a and sets alternator 50 to the power generation mode. More specifically, eco-run ECU 230 outputs signal M/G for causing alternator 50 to operate in the power generation mode to control circuit 20. Then, control circuit 20 drives alternator 50 in the power generation mode with the method described above, in response to signal M/G from eco-run ECU 230.

Then, the rotation power of crank shaft 110a of engine 110 is transmitted to the rotation shaft of alternator 50 through pulley 140, belt 170 and pulley 160. Alternator 50 generates electric power, and outputs the AC voltage to control circuit 20. Control circuit 20 converts the AC voltage to the DC voltage in accordance with control of eco-run ECU 230, so as to charge battery 10. The motor control processing during running is thus completed.

In this manner, during normal running, alternator 50 is driven in the power generation mode, and the rotation power of engine 110 is converted to electric energy.

On the other hand, if eco-run ECU 230 determines that the vehicle is in deceleration, the motor control processing during deceleration is performed. Finally, the motor control processing during deceleration will be described. When the motor control processing during deceleration is started, eco-run ECU 230 determines whether or not cutting-off of fuel supply in deceleration has been completed. Under a condition determined as deceleration, fuel injection to engine 110 is stopped by a processing to cut off fuel supply during deceleration by engine ECU 240, until the number of revolutions of engine 110 is lowered to attain the recovery reference number of revolutions for determining return to fuel injection (that is, the target number of revolutions during idle).

If the number of revolutions of engine 110 is lowered to the recovery reference number of revolutions, torque converter 120 is switched from a lockup state to the non-lockup state and fuel injection is resumed, so as to prevent engine stall due to fall of the number of revolutions of the engine.

If the fuel is being cut off during deceleration, eco-run ECU 230 turns on electromagnetic clutch 140*a*, and sets alternator 50 to electric power generation at a power generation voltage higher than a normal power generation voltage. Accordingly, even if engine 110 is not operated, crank shaft 110*a* of engine 110 is rotated by rotation of wheels, and rotation of crank shaft 110*a* is transmitted to alternator 50 through pulley 140, belt 170 and pulley 160. Alternator 50 generates the AC voltage. Therefore, energy generated by running of a vehicle is recovered as electric power. In other words, the power generation mode of alternator 50 here is comparable to a regenerative mode.

When the number of revolutions of engine is lowered to the recovery reference number of revolutions, engine ECU 240 ends the processing to cut off the fuel supply. Then, eco-run ECU 230 determines whether or not the number of revolutions of the engine is smaller than the engine stall reference number of revolutions. The engine stall reference number of revolutions is smaller than the recovery reference number of revolutions. In addition, determination as to whether or not the number of revolutions of the engine is smaller than the engine stall reference number of revolutions is made in order to identify a situation where the number of revolutions of the engine significantly falls which may lead to engine stall in spite of resuming of fuel injection.

If eco-run ECU 230 determines that the number of revolutions of the engine is larger than the engine stall reference number of revolutions, alternator 50 is stopped. On the other hand, if eco-run ECU 230 determines that the number of revolutions of the engine is smaller than the engine stall reference number of revolutions, it turns on electromagnetic clutch 140*a* and drives alternator 50 so that the number of revolutions of the engine attains the target number of revolutions during idle.

In this manner, the rotation power of alternator 50 is transmitted to crank shaft 110*a* through pulley 160, belt 170 and pulley 140, so as to rotate crank shaft 110*a*. Then, if eco-run ECU 230 determines that the number of revolutions of the engine has attained the target number of revolutions during idle, alternator 50 is stopped.

If engine 110 has difficulty in returning from a fuel supply cut-off state to operation after the processing to cut off fuel supply in deceleration, the number of revolutions of the engine is raised by means of alternator 50, so as to prevent engine stall.

In cold start of the engine, eco-run ECU 230 controls starter 174 in accordance with manipulation of the ignition switch by the driver, and starter 174 starts engine 110. In addition, during normal running after the vehicle equipped with engine system 200 is started, eco-run ECU 230 outputs signal M/G for causing alternator 50 to operate as the drive motor to control circuit 20, and control circuit 20 drives alternator 50 as the drive motor in response to signal M/G with the operation described above. The torque generated by alternator 50 is transmitted to driving wheels of the vehicle equipped with engine system 200 through pulley 160, belt 170, pulley 140, crank shaft 110*a*, torque converter 120, automatic transmission 130, and output shaft 130*a*.

As described above, in engine system 200, control circuit 20 controlling alternator 50 is provided on the end surface of alternator 50, and drives alternator 50 as the drive motor or the generator in accordance with the instruction from eco-run ECU 230.

Figure 7:
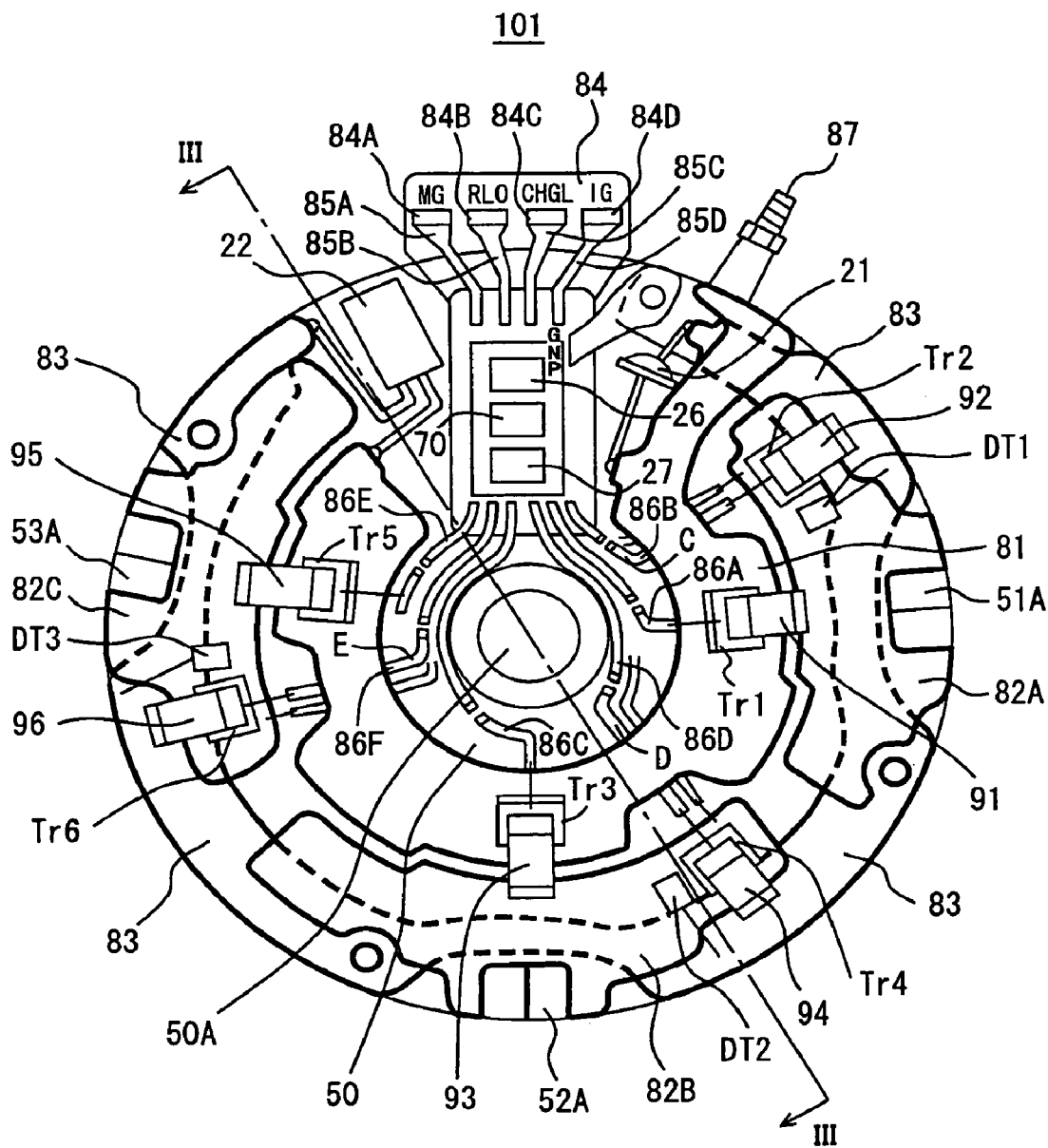
FIG. 7 is another plan view of the generator-motor according to the present invention.
Figure 9:
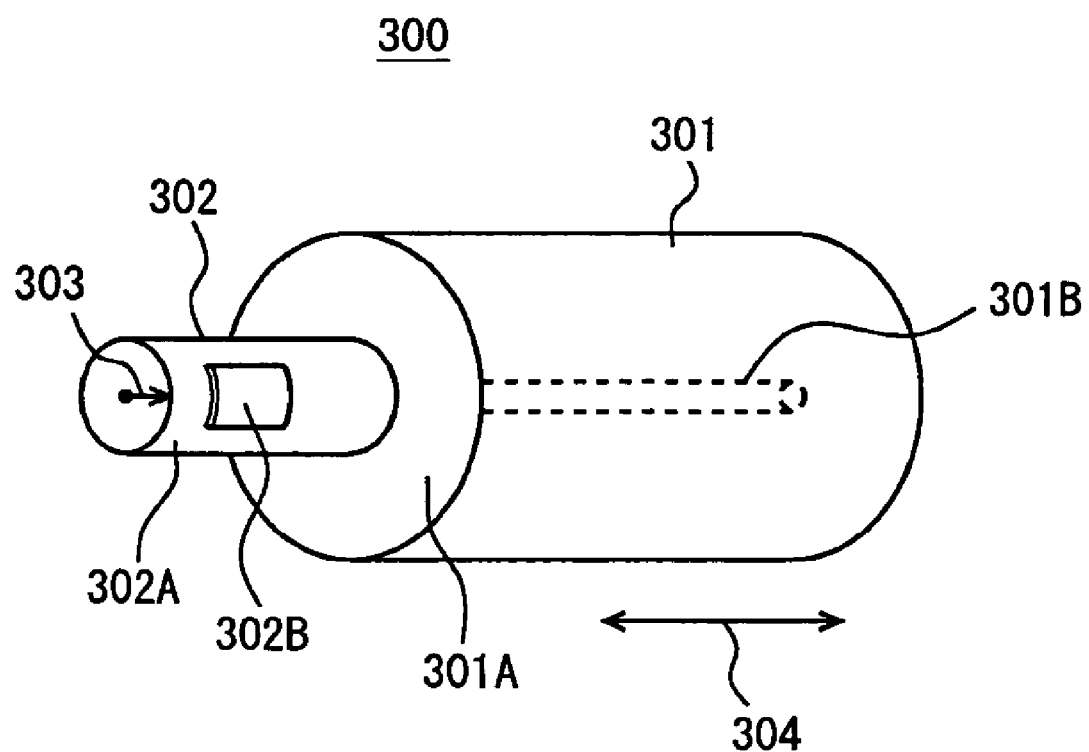
FIG. 9 is a perspective view of a conventional starter-generator.

The generator-motor according to the present invention may be a generator-motor 101 shown in FIG. 7. Referring to FIG. 7, in generator-motor 101, though MOS transistors Tr1 to Tr6 are connected to electrode plates 82A to 82C, 83 by flat electrodes 91 to 96 instead of wire bonding (W/B) in generator-motor 100 shown in FIG. 1, generator-motor 101 is otherwise the same as generator-motor 100.

Each of flat electrodes 91 to 96 is made of a copper-based material, and has a thickness in a range from 0.1 to 2.0 mm.

Flat electrode 91 connects the source of MOS transistor Tr1 to electrode plate 82A. Flat electrode 92 connects the source of MOS transistor Tr2 to electrode plate 83. Flat electrode 93 connects the source of MOS transistor Tr3 to electrode plate 82B. Flat electrode 94 connects the source of MOS transistor Tr4 to electrode plate 83. Flat electrode 95 connects the source of MOS transistor Tr5 to electrode plate 82C. Flat electrode 96 connects the source of MOS transistor Tr6 to electrode plate 83.

FIG. 8A is a plan view of MOS transistor Tr1 shown in FIG. 7, while FIG. 8B is a cross-sectional view of MOS transistor Tr1 and electrode plates 81, 82A. In FIGS. 8A and 8B, wire GL in FIGS. 2A and 2B is replaced with flat electrode 91, and FIGS. 8A and 8B are otherwise the same as FIGS. 2A and 2B.

Flat electrode 91 connects source S of MOS transistor Tr1 to electrode plate 82A, and otherwise the description in connection with FIGS. 2A and 2B also applies here.

MOS transistors Tr2 to Tr6 shown in FIG. 7 are also connected to electrode plates 82B, 82C, 83 by flat electrodes 92 to 96 respectively, in a manner similar to MOS transistor Tr1.

In this manner, in generator-motor 101, MOS transistors Tr1 to Tr6 are connected to electrode plates 82A, 83, 82B, 83, 82C, 83 by flat electrodes 91 to 96, respectively.

When MOS transistors Tr1 to Tr6 are connected to electrode plates 82A, 83, 82B, 83, 82C, 83 by flat electrodes 91 to 96 respectively, heat generated in MOS transistors Tr1 to Tr6 is dissipated through flat electrodes 91 to 96. As a result, when MOS transistors Tr1 to Tr6 are connected to electrode plates 82A to 82C, 83 by W/B as in generator-motor 100, a ratio of area of electrode plates 81, 82A to 82C to that of MOS transistors Tr1 to Tr6 should be set to not smaller than 6 in order to cool MOS transistors Tr1 to Tr6 so that temperature increase in MOS transistors Tr1 to Tr6 is not larger than a tolerance limit. On the other hand, when MOS transistors Tr1 to Tr6 are connected to electrode plates 82A to 82C, 83 by flat electrodes 91 to 96 respectively as in generator-motor 101, a ratio of area of electrode plates 81, 82A to 82C to that of MOS transistors Tr1 to Tr6 for cooling MOS transistors Tr1 to Tr6 so that temperature increase in MOS transistors Tr1 to Tr6 is not larger than a tolerance limit can be made smaller than 6.

Accordingly, if an area for MOS transistors Tr1 to Tr6 is constant, an area for electrode plates 81, 82A to 82C can be made smaller by connecting MOS transistors Tr1 to Tr6 to electrode plates 82A to 82C, 83 using flat electrodes 91 to 96 respectively.

Here, it goes without saying that generator-motor 101 is applicable to engine system 200.

In the present invention, alternator 50 includes a stator and a rotor, and implements a "motor" attaining a function as the motor-generator.

In addition, MOS transistors Tr1 to Tr6 constitute a "polyphase switching element group" controlling a current to be fed to the stator.

Moreover, in the present invention, control circuit 20, electrode plates 81, 82A to 82C, 83, 84, and wires 86A to 86F constitute a "control device" controlling drive of the motor.

Furthermore, wires 86A to 86F constitute a "leadframe" extending from substrate 84 (implemented by a ceramic substrate) to electrode plates 81, 82A to 82C, 83.

According to the description above, MOS transistors Tr1 to Tr6 control a current fed to U-phase coil 51, V-phase coil 52 and W-phase coil 53 of alternator 50. In the present invention, however, a switching element such as an IGBT (Insulated Gate Bipolar Transistor), an NPN transistor, and the like may be employed instead of MOS transistors Tr1 to Tr6.

In addition, in the present embodiment, though the eco-run ECU and the engine ECU have separately been provided, one engine control ECU can be implemented by integrating their functions. Moreover, the transmission in the present embodiment is not limited to AT (what is called an automatic transmission), and it can be implemented by a combination of known transmissions such as a CVT and an MT.

In the present embodiment, though a function to drive the auxiliary machinery is attained by electromagnetic clutch 140a, the function to drive the auxiliary machinery may not be provided for simplification of the system (it is not necessary to provide electromagnetic clutch 140a).

Furthermore, the present embodiment is applicable to a hybrid vehicle in which the motor is able to generate a large driving force in spite of being adapted to an eco-run system. The present invention can be achieved even if alternator 50 is replaced by another well-known generator-motor (also referred to as a motor-generator). That is, a generator-motor capable of applying a torque necessary for driving the vehicle or starting the engine should only be selected as appropriate.

Although the present invention has been described and illustrated in detail, it is clearly understood that the same is by way of illustration and example only and is not to be taken by way of limitation, the spirit and scope of the present invention being limited only by the terms of the appended claims.

INDUSTRIAL APPLICABILITY

The present invention is applicable to a compact generator-motor, or a generator-motor provided with a control device attaining high cooling efficiency, or a generator-motor provided with a control device attaining shorter length and simplification of wires.

The invention claimed is:

1. A generator-motor comprising:
a motor including a rotor and a stator and having a drive mode and a power generation mode; and
a control device arranged on an end surface of said motor so as to surround a rotation shaft of said motor and controlling drive of said motor, wherein the control device controls the motor to function as a motor under the drive mode and as a generator under the power generation mode and includes a plurality of electrode plates that are radially offset from each other.

2. The generator-motor according to claim 1, wherein
the plurality of electrode plates includes first, second and third electrode plates arranged so as to substantially form a U-shape to surround the rotation shaft of said motor, and
said control device further includes a polyphase switching element group controlling a current supplied to said stator,
said polyphase switching element group is constituted of a plurality of arms, a number of the arms corresponding to a number of phases of said motor, and each arm constituted of first and second switching elements,
said first electrode plate is arranged in a position apart from said rotation shaft by a prescribed distance in a direction perpendicular to said rotation shaft,
said second and third electrode plates are arranged outside said first electrode plate,
said first and second switching elements are connected electrically in series between said first electrode plate and said third electrode plate,
said plurality of first switching elements are arranged on said first electrode plate, and
said plurality of second switching elements are arranged on said second electrode plate.

3. The generator-motor according to claim 2, wherein
said control device further includes a control circuit controlling said plurality of first and second switching elements, and
said control circuit is provided on a ceramic substrate arranged in a direction similar to an inplane direction of said first, second and third electrode plates in a substantially U-shaped notch.

4. The generator-motor according to claim 3, wherein
said control device further includes
a plurality of first wires connecting said control circuit to said plurality of first switching elements, and
a plurality of second wires connecting said control circuit to said plurality of second switching elements,
said plurality of first wires are arranged between said rotation shaft and said first electrode plate so as to surround said rotation shaft, and
said plurality of second wires are arranged between said rotation shaft and said first electrode plate and between said first electrode plate and said motor.

5. The generator-motor according to claim 4, wherein
each of said plurality of first and second switching elements includes
a control terminal receiving a control signal from said plurality of first wires or said plurality of second wires,
an input terminal receiving a direct current, and
an output terminal outputting a direct current in accordance with control contents by said control signal,
said input terminal of said first switching element is in contact with said first electrode plate,
said control terminal of said first switching element is arranged on a side of said rotation shaft and connected to said first wire,
said output terminal of said first switching element is arranged on a side of said second electrode plate and connected to said second electrode plate,
said input terminal of said second switching element is in contact with said second electrode plate,
said control terminal of said second switching element is arranged on a side of said rotation shaft and connected to said second wire, and
said output terminal of said second switching element is arranged on a side of said third electrode plate and connected to said third electrode plate.

6. The generator-motor according to claim 2, wherein said first and second electrode plates are arranged in a first plane, and said third electrode plate is arranged in a second plane different from said first plane.

7. The generator-motor according to claim 6, wherein said second plane is located closer to said motor than said first plane is.

8. The generator-motor according to claim 2, wherein
said plurality of arms are radially arranged in the inplane direction of said first, second and third electrode plates.

9. The generator-motor according to claim 1, wherein
the plurality of electrode plates includes first and second electrode plates arranged so as to substantially form a U-shape to surround the rotation shaft of said motor,
said control device includes a polyphase switching element group controlling a current supplied to said stator, and
a control circuit controlling said polyphase switching element group, and
said control circuit is provided on a ceramic substrate arranged in a direction similar to an inplane direction of said first and second electrode plates in a substantially U-shaped notch.

10. The generator-motor according to claim 9, wherein said control circuit is resin-molded.

11. The generator-motor according to claim 9, wherein
said control device further includes a Zener diode protecting said polyphase switching element group against surge, and
said Zener diode is arranged in said notch.

12. The generator-motor according to claim 9, wherein
said control device further includes a capacitive element smoothing a DC voltage from a DC power supply and supplying the smoothed DC voltage to said polyphase switching element group, and
said capacitive element is arranged between said ceramic substrate and said second electrode plate.

13. The generator-motor according to claim 9, wherein
said control device further includes a field coil control unit controlling current feed to a field coil different from said stator, and
said field coil control unit is arranged on said ceramic substrate.

14. The generator-motor according to claim 9, wherein
a leadframe continuing to said first and second electrode plates from said ceramic substrate and said first and second electrode plates are arranged in an identical plane.

* * * * *